(12) United States Patent
Wakabayashi

(10) Patent No.: US 6,472,287 B2
(45) Date of Patent: Oct. 29, 2002

(54) MANUFACTURING METHOD OF SEMICONDUCTOR WITH A CLEANSING AGENT

(75) Inventor: Masaru Wakabayashi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/090,626

(22) Filed: Mar. 6, 2002

(65) Prior Publication Data

US 2002/0127832 A1 Sep. 12, 2002

(30) Foreign Application Priority Data

Mar. 8, 2001 (JP) ........................................ 2001-065055

(51) Int. Cl.[7] ............................................. H01L 21/331
(52) U.S. Cl. ........................ 438/365; 438/372; 438/564
(58) Field of Search ................................. 438/234, 364, 438/365, 369, 372, 564

(56) References Cited

U.S. PATENT DOCUMENTS 4,735,916 A * 4/1988 Homma et al. ............. 438/366
4,797,372 A * 1/1989 Verret et al. ................ 438/234
2001/0051413 A1 * 12/2001 Chantre et al. ............. 438/364

FOREIGN PATENT DOCUMENTS

| JP | 02-081429 | 3/1990 |
| JP | 06-069225 | 3/1994 |

* cited by examiner

Primary Examiner—Chandra Chaudhari
(74) Attorney, Agent, or Firm—Young & Thompson

(57) ABSTRACT

The present invention aims to suppress certainly the single-crystallizing in polycrystalline silicon that is to compose an emitter electrode, as well as to prevent the interface oxide film from remaining, when a heat treatment is conducted to diffuse dopants, and thereby it is also aimed to regulate the emitter dopant concentrations according to the design as well as to lower the emitter electrode resistance, which will provide a stable $h_{FE}$; and further, the present invention aims to prevent anomalous bodies such as water-marks to be accidentally produced in a cleaning step following dry etching step to form an emitter electrode, and thereby to achieve an increase in yield as well as an enhancement of device reliability; in the process of the present invention, after an insulating film 4 and a first polycrystalline silicon film 5 are selectively dry etched to form a contact hole, a substrate is cleaned with such a cleansing agent as that composed of ammonia, hydrogen peroxide and water.

20 Claims, 9 Drawing Sheets

(a)

(b)

(a)

(b)

MANUFACTURING METHOD OF SEMICONDUCTOR WITH A CLEANSING AGENT

BACKGROUND OF THE INVENTION

1. Field of the Invention

The present invention relates to a process for manufacturing a bipolar transistor.

2. Description of the Prior Art

The structures of bipolar transistors can be classified into two groups; a conventional type and a SST (Super Self-alignment Technology) type. The structure referred to the conventional type is generally made by forming a collector region and a base region in a substrate by the ion implantation technology or the like, and thereafter forming an emitter electrode above it and diffusing thermally dopants from this emitter electrode to form an emitter region in the base region. Referring to FIG. 7, the manufacturing method of a bipolar transistor with a conventional structure is described in detail below.

First, as shown in FIG. 7(a), n-type dopants are ion-implanted into the surface of a p-type silicon substrate 1 to form a collector region 2, and p-type dopants are then ion-implanted to form a base region 3 on the surface of the collector region 2. Over these, sequentially, an insulating film 4 and a first polycrystalline silicon film 5 are grown in this order (FIG. 7(b)). On this first polycrystalline silicon film 5, a resist 6 having an opening is formed (FIG. 7(c)), and using this resist as a mask, a contact hole to reach the base region is formed by means of dry etching. In this state, 7 may attach onto the inside of the contact hole (FIG. 7(d)).

Subsequently, ashing and a treatment with a resist-peeling agent are carried out, and then a cleaning using hydrofluoric acid or its salt is carried out, and followed by a rinsing with pure water. Thereby, the resist and the residues from etching 7 are removed. Hereupon, anomalous bodies 8 derived from the remnant solution of hydrofluoric acid after rinsing may reattach onto the first polycrystalline silicon film 5 and the inside of the contact hole (FIG. 8(a)). Next, after a second polycrystalline silicon film 11 is grown over the entire surface of the substrate so as to fill up the inside of the contact hole, n-type dopants are ion-implanted into the second polycrystalline silicon film 11 and, then, by applying a heat treatment to the whole substrate, the n-type dopants are made to diffuse into the base region 3 to form an emitter region 14. After that, the first polycrystalline silicon film 5 and the second polycrystalline silicon film 11 are shaped into an emitter electrode 15 by selective dry etching, whereby a bipolar transistor is accomplished (FIG. 8(b)).

This conventional technique has, however, the following problems, because anomalous bodies 8 derived from the remnant solution of hydrofluoric acid after rinsing may reattach onto the first polycrystalline silicon film 5 and the inside of the contact hole, as shown in FIG. 8(a). First, when the emitter opening section is formed by dry etching, anomalous bodies lying on the first polycrystalline silicon film serve as a mask, and cause etching remnants. Secondly, since anomalous bodies 8 happen to remain also on the interface between the emitter electrode 15 and the base region 3, they lead to incomplete diffusion of emitter dopants, and thus in some cases, the emitter region may fail to be formed as designed or the emitter electrode resistance may become high.

Next, the so-called SST (Super Self-alignment Technology) structure is described below. In the SST structure, an outer base region is formed around an emitter in the manner of self-alignment and connected to a base electrode through a polycrystalline silicon film. It is different from the afore-mentioned conventional structure that a polysilicon film for lead of the base is formed on a substrate and a plurality of heat treatments are required to form a base region by thermal diffusion.

FIG. 5 is a process for manufacturing a bipolar transistor with a SST structure, disclosed in Japanese Patent Application Laid-open No. 6-69225. Firstly, an element isolation oxide film 504 is formed on an epitaxial substrate, wherein an n$^+$ collector buried layer 502 and n$^-$ collector epitaxial layer 503 are formed on a p-type silicon substrate 501. Next, after a boron-doped base polysilicon film 505 is grown and then patterned, a silicon oxide film 506 is grown and, in a region where an emitter is to be formed, an opening is formed through the silicon oxide film 506 and the p$^+$-type base polysilicon film 505 to expose the n collector epitaxial layer 503 (FIG. 5(a)). Following that, a silicon oxide film is grown over the entire surface and this oxide film is etched by anisotropic etching such as the RIE (Reactive Ion Etching) to form sidewalls 507 of the silicon oxide film. A heat treatment is then applied thereto in a nitrogen atmosphere to form p$^+$-type outer base diffusion region 508 (FIG. 5(b)). Next, a polysilicon film 509 that is to serve as an emitter electrode is grown under such a condition that loading of polysilicon deposition apparatus at low temperature or while making hydrogen substitution may allow only little natural oxide film to grow on the interface with the epitaxial layer 503, and then boron 510 is ion-implanted into this polysilicon film 509. Subsequently, by applying a lamp heating thereto, for example, at 1050° C. for 60 seconds in a nitrogen atmosphere, boron is made to make solid phase diffusion from the emitter polysilicon film 509 to the n epitaxial layer 503 to form a boron diffusion region 511 that is to serve as an inner base diffusion region (FIG. 5(c)). After that, arsenic 512 is ion-implanted into the polysilicon film 509 and then, by applying a lamp heating thereto, for example, at 1050° C. for 10 seconds in a nitrogen atmosphere, arsenic is made also to make solid phase diffusion from the emitter polysilicon film 509 to the n epitaxial layer 503 to form an emitter diffusion region 513 as well as a base diffusion region 511' in the manner of self-alignment (FIG. 5(d)). The emitter polysilicon film 509 is then shaped into an emitter polysilicon electrode 509 by patterning. Finally, an opening is made for a base contact and a metal electrode 514 is plated over the emitter polysilicon electrode 509' and the polysilicon electrode 505 for lead of the base and, then, patterned (FIG. 5(e)). The use of the steps of the double diffusion method as described above allows a bipolar transistor with a shallow base diffusion region to be obtained, which decreases various parasitic resistances and capacitances.

While, in order to reduce the emitter resistance, the above process employing the double diffusion method prevent any oxide film from growing on the epitaxial layer 503, but repeated lamp annealing results in the enlargement of crystalline grains in the emitter polysilicon film 509 that is the very source of diffusion. This single-crystallizing event makes it hard to control the concentrations of the dopants and the depth in the emitter-base junction section, and thus bringing about deviation in the diffusion profile.

As for a process to overcome such a problem, the publication set forth discloses another process for manufacturing, as shown in FIG. 6. Firstly, following the same steps as a conventional manufacturing process, the fabrication steps proceeds up to the step of forming a Pa diffusion region 103.

In the preceding steps, conditions of pretreatment, loading into a deposition furnace and the like are to be regulated so that such an oxide film 105 as a natural oxide film of a thickness not less than 5 angstroms but not more than 20 angstroms will be formed on the surface that is to become the interface between an epitaxial layer 101 and an emitter polysilicon layer 104 (FIG. 6(a)). Next, keeping the oxide film 105, an emitter polysilicon film 104 is grown over the entire surface of the epitaxial layer 101 (FIG. 6(b)). After that, boron 106 is ion-implanted into this emitter polysilicon film 104 (FIG. 6(c)). By applying a heating in a furnace thereto, for example, at 900° C. for 20 minutes in a nitrogen atmosphere, boron is then made to make solid phase diffusion from the emitter polysilicon film 104 to the n⁻ epitaxial layer to form a boron diffusion region 107, and so as to prevent the emitter polysilicon film 104 from single-crystallizing by the solidphase epitaxial growth. Subsequently, arsenic 108 is ion-implanted into the polysilicon film 104 (FIG. 6(d)).

After that, by applying a heating in a furnace thereto, for example, at 900° C. for 10 minutes in a nitrogen atmosphere, arsenic is made to make solid phase diffusion from the emitter polysilicon film 104 to the n⁻ epitaxial layer 101 to form an emitter diffusion region 109 as well as a base diffusion region 107 in the manner of self-alignment. Dopants are then activated by a lamp annealing performed, for example, at 1000° C. for 10 seconds in a nitrogen atmosphere. The heat applied thereat converts the oxide film 105 into balled-up oxides 105', by which a low-resistance electric contact between the polysilicon film 104 and the epitaxial layer 101 will be obtained (FIG. 6(e)). After that, the polysilicon film is patterned and, finally, an opening is made for a base contact and a metal electrode is plated over the emitter polysilicon electrode and the base polysilicon electrode and then patterned. It is described therein that, with such a process employed, excellent controllability of the base-emitter diffusion profile can be achieved.

Nevertheless, this technique has a problem that it is hard to adapt the treatment conditions for shaping the oxide film 105 on the boundary surface into a form easy to ball up. Although it is described in the publication set forth that the oxide film 105 on the interface can be easily prepared in the thickness suitable for easy balling up by regulating conditions of pretreatment, loading into a deposition furnace to apply and the like, such controls are not always achieved easily. Furthermore, particularly when such a high temperature heat treatment as a lamp heating is applied, it is difficult for such an oxide film to suppress successfully the single-crystallizing from the polycrystalline silicon that is to constitute the emitter electrode, and in some cases which causes a lowering and a deviation of the current amplification factor ($h_{FE}$) and an increase in the emitter electrode resistance.

BRIEF SUMMARY OF THE INVENTION

Object of the Invention

The present invention was achieved in light of these aforementioned problems; that is to said, an object of the present invention is to suppress certainly the enlargement of the crystalline grain (single-crystallizing) in polycrystalline silicon that is to compose an emitter electrode, as well as to prevent the interface oxide film from remaining, when a heat treatment is conducted to diffuse dopants, and thereby it is also aimed to regulate the emitter dopant concentrations according to the design as well as to lower the emitter electrode resistance, which will provide a stable $h_{FE}$.

Further, the present invention aims to prevent anomalous bodies such as water-marks to be accidentally produced in a cleaning step following dry etching step to form an emitter electrode, and thereby to achieve an increase in yield as well as an enhancement of device reliability.

SUMMARY OF THE INVENTION

The present invention provides a process for manufacturing a semiconductor device; comprising the steps of:
  forming a collector region of a first conductive type in the vicinity of the surface of a silicon substrate and a base region of a second conductive type to lie on the surface of the collector region;
  forming an insulating film on said silicon substrate;
  forming a contact hole to reach said base region by etching said insulating film selectively;
  cleaning the surface of said insulating film and the inside of said contact hole, using a cleansing agent containing an oxidant and an alkali;
  forming a polycrystalline silicon film over the entire surface so as to fill up said contact hole and thereafter implanting dopants of the first conductive type into said polycrystalline silicon film;
  applying a heat treatment to the whole substrate to diffuse said dopants into said base region and thereby forming an emitter region of the first conductive type; and
  shaping said polycrystalline silicon film into an emitter electrode by selective etching.

According to the present invention, when a heat treatment is conducted to diffuse dopants, the single-crystallizing in polycrystalline silicon can be suppressed certainly, and also the remaining of the interface oxide film can be prevented. Hereby this can lower the emitter electrode resistance and regulate the emitter dopant concentrations according to the design, which leads to a stable $h_{FE}$. In contrast, in conventional techniques, when dopants are diffused into the base region to form an emitter region by heat treatment of the whole substrate, the polycrystalline silicon in the vicinity of the substrate may be often single-crystallized, which gives rise to an increase in emitter resistance and a retard of the dopant diffusion, as mentioned above. The preset invention overcomes such a problem by carrying out a cleaning, using a cleansing agent containing an oxidant and an alkali, so that it can lower the emitter electrode resistance and regulate the emitter dopant concentrations according to the design, which will provide a stable $h_{FE}$. What causes these effects and advantages to be attained are presumably ascribed to the increased roughness of surfaces at the bottom section of the contact hole and at the exposed portion of the surface of single crystal silicon substrate within the opening, and to thin films of silicon oxide formed thereon. The single-crystallizing in polycrystalline silicon on the base region surface originates from the surface of the single crystal substrate and progresses along. In conventional techniques, an oxide film covers the surface of the silicon substrate that is the initiation origin for growth, so that the growth in single crystals is prevented. On the other hand, in the present invention, the growth of single crystal is inhibited not only by covering the initiation origin for growth with an oxide film but also by the reduced smoothness of the surface for growth. Further, the oxide film itself is formed through the use of a cleansing agent, so that its thin thickness can be better controlled, and what is more, its film quality can be more uniform, in comparison with those formed by thermal oxidation or natural oxidation in the air. In consequence, it can ball-up certainly, so that it can lower the emitter electrode resistance and regulate the emitter dopant concentrations according to the design, which leads to a stable $h_{FE}$.

Further, according to the present invention, there are employed the steps wherein a collector region and a base region are formed within a substrate beforehand and, subsequently, dopants are thermally diffused to form an emitter region by the heat treatment, so that this step requires only one heat treatment. Therefore, this can prevent the single-crystallizing of the polycrystalline silicon film that is the source of emitter diffusion. In the afore-mentioned process for forming a SST structure using a double diffusion method, it is required to apply lamp heatings thereto repeatedly so that the single-crystallizing in the emitter polysilicon film causes a serious problem. In contrast with this, since the present invention requires the heat treatment only once for the dopant diffusion, this also facilitates to suppress the single-crystallizing in the polycrystalline silicon film effectively.

In addition, the present invention provides a process for manufacturing a semiconductor device; comprising the steps of:

forming a collector region of a first conductive type in the vicinity of the surface of a silicon substrate and a base region of a second conductive type to lie on the surface of said collector region;

forming an insulating film and a first polycrystalline silicon film on said silicon substrate in this order;

forming a contact hole to reach said base region by etching said insulating film and the first polycrystalline silicon film selectively:

cleaning the surface of said first polycrystalline silicon film and the inside of said contact hole, using a cleansing agent containing an oxidant and an alkali:

forming a second polycrystalline silicon film over the entire surface so as to fill up said contact hole and thereafter implanting dopants of the first conductive type into said first and second polycrystalline silicon films;

applying a heat treatment to the whole substrate to diffuse said dopants into said base region and thereby forming an emitter region of the first conductive type; and shaping said first and second polycrystalline silicon films into an emitter electrode by selective etching.

This invention exhibits the effects described above, that is, as it can suppress the single-crystallizing in the polycrystalline silicon and prevent the interface oxide film from remaining, it can thereby lower the emitter electrode resistance and regulate the emitter dopant concentrations according to the design, which will provide a stable $h_{FE}$, and apart from these, the present invention has further effects and advantages as follows.

In the present invention, polycrystalline silicon constituting the emitter electrode is formed in two separate steps for the first and the second polycrystalline silicon films. This increases the degree of freedom for choice of the cleansing agent used in cleaning the inside of the contact hole after its formation. When a polycrystalline silicon film is formed in one step, for instance, if, after the opening section for the emitter is formed by etching, a cleaning is conducted using a cleansing agent containing hydrofluoric acid or its salt for the purpose of removing etching residues, an insulating film such as a silicon oxide film may be also dissolved, which leads to the film thinning or proceeding in side etching within the contact hole, and thereby the fabrication of devices as designed may become difficult occasionally. In the present invention, as the first polycrystalline silicon film is formed on the insulating film, such a structure, where the insulating film is covered with the first polycrystalline silicon film, can solve a problem of this sort. Meanwhile, when such a process is employed, the remaining of the cleansing agent is liable to occur on the first polycrystalline silicon film. The surface of the polycrystalline silicon is higher hydrophobic than those of the insulating films such as a silicon oxide film, so that water-marks and anomalous bodies tend to reattach thereto. The present invention may solve this problem specific to the case in which polycrystalline silicon constituting an emitter electrode is formed in two separate steps for a first and a second polycrystalline silicon films. Namely, by cleaning the surface of the first polycrystalline silicon film and the inside of the contact hole using a cleansing agent containing an oxidant and an alkali, the underlying layer, on which the second polycrystalline silicon film is deposited, is made hydrophilic, whereby water-marks and anomalous bodies are prevented from reattaching thereto. As a result, an increase in yield as well as an enhancement of device reliability can be attained.

Besides, the first conductive type and second conductive type as used in the present invention can take either combination, as long as they represent opposite conductive types, respectively. In other words, the first conductive type and second conductive type may be n-type and p-type, or alternatively, p-type and n-type, respectively.

In a process for manufacturing a semiconductor device according to the present invention, after forming the foregoing contact hole, cleaning may be first carried out with a cleansing agent containing hydrofluoric acid or its salt, and said cleaning with the cleansing agent containing an oxidizing agent and an alkali is then conducted. This procedure can remove etching residues effectively.

In this case, after the former cleaning is carried out with a cleansing agent containing hydrofluoric acid or its salt, the latter cleaning may be conducted in such manners as follows.

(i) A cleaning with a cleaning agent containing an oxidant and an acid is performed, and thereafter the cleaning with the cleansing agent containing the oxidant and the alkali is conducted.

(ii) The cleaning with the cleansing agent containing the oxidant and the alkali is performed, and thereafter another cleaning with a cleansing agent containing an oxidant and an acid is conducted.

DETAILED DESCRIPTION OF THE PREFERRED EMBODIMENTS

Figure 1:
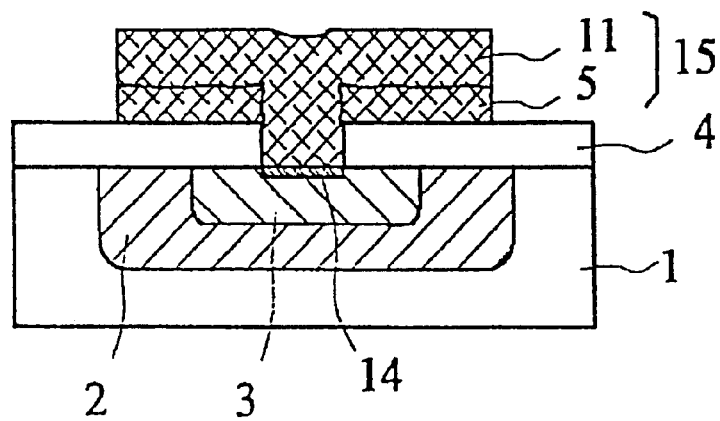
FIGS. 1(a) and (b) illustrate schematic cross-sectional views of examples of a bipolar transistor obtainable by a manufacturing method of the present invention.
Figure 1:
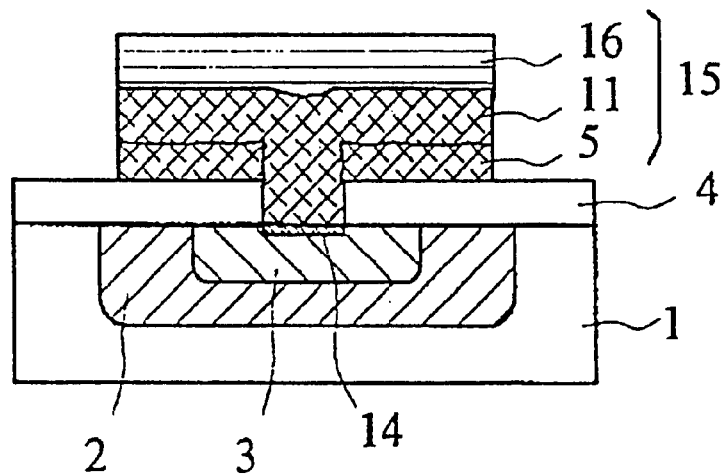

FIG. 1(a) shows one example of a bipolar transistor obtainable by a manufacturing method according to the present invention. A collector region 2 is formed in the vicinity of the surface of a silicon substrate 1; and a base region 3 is formed on the surface of this collector region 2 so as to be enveloped in the collector region 2. An emitter electrode composed of a first polycrystalline silicon film 5 and a second polycrystalline silicon film 11 is formed on the silicon substrate 1 with an insulating film 4 lying there between; and an emitter region 14 is formed in a part where the emitter electrode 15 comes into contact with the silicon substrate 1. Further, FIG. 1(b) shows an example that uses an emitter electrode 15 composed of tungsten 16 and polycrystalline silicon. The present invention can be applied to a bipolar transistor having such a structure as shown in FIG. 1(b), too. Hereafter, referring to a bipolar transistor shown in FIG. 1(a) as an example, one example of a process for manufacturing in accordance with the present invention is described in detail.

Figure 2:
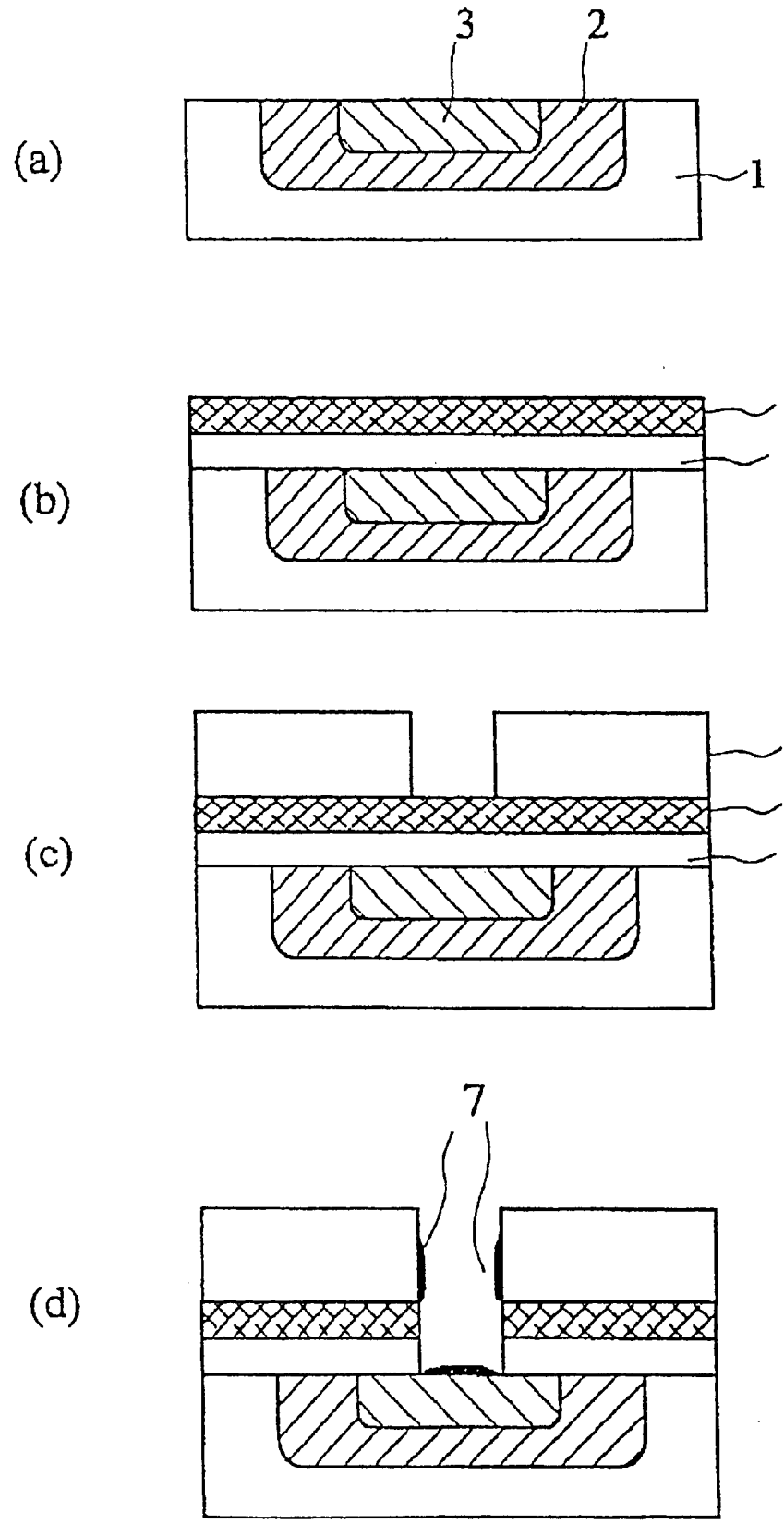
FIGS. 2(a) to (d) are a series of views explaining steps for forming an opening to reach a base region in a process of the present invention.

First, as shown in FIG. 2(a), n-type dopants is ion-implanted into the surface of a p-type silicon substrate 1 to form a collector region 2 and, then, p-type dopants is ion-implanted into the surface of the collector region 2 to form a base region 3. Following that, an insulating film 4 is formed over these. Silicon oxide film is in general used for the insulating film 4. In this preferred embodiment, a HTO (High Temperature Oxide) film is employed for it, and is grown by the LPCVD (Low Pressure Chemical Vapour Deposition) method under circumstances heated up to 800–820° C. or so. The film thickness is set to be, for example, 50–100 nm or so. Next, a first polycrystalline silicon film 5 is deposited thereon into a thickness of 50–100 nm or so (FIG. 2(b)).

On this first polycrystalline silicon film 5, a resist 6 having an opening is formed (FIG. 2(c)), and using this resist as a mask, a contact hole to reach the base region 3 is formed by means of dry etching. In this state, etching residues 7 may attach onto the inside of the contact hole (FIG. 2(d)).

Subsequently, ashing and a treatment with a resist-peeling agent are conducted and, then, a cleaning is carried out using hydrofluoric acid or its salt, and followed by rinsing with pure water. The resist and the etching residues 7 are removed by these steps. Hereat, anomalous bodies 8 due to the remnant solution of hydrofluoric acid after rinsing may reattach onto the first polycrystalline silicon film 5 and the inside of the contact hole (FIG. 3(a)). While, in conventional techniques, no treatment is performed for these anomalous bodies, a removing treatment with a cleansing agent is carried out in the present invention. In this cleaning treatment, (i) a cleaning with a cleansing agent containing an oxidant and an alkali is essential, and (ii) a cleaning with a cleansing agent containing an oxidant and an acid is performed appropriately. For an oxidant, hydrogen peroxide or the like is preferably utilized. Further, examples of the alkali include ammonia and the like, and sulfuric acid, hydrochloric acid and the like can be exemplified for typical examples of the acid.

Examples of the specific procedure for this cleaning treatment are listed below:
(a) APM cleaning;
(b) SPM cleaning→APM cleaning;
(c) APM cleaning→HPM cleaning;
(d) SPM cleaning→APM cleaning→HPM cleaning;
wherein
APM is a cleansing agent composed of ammonia, hydrogen peroxide and water;
SPM is a cleansing agent composed of sulfuric acid, hydrogen peroxide and water; and
HPM is a cleansing agent composed of hydrochloric acid, hydrogen peroxide and water. Herein, steps of rinsing with pure water between these steps of cleaning or further step of cleaning with a hydrogen peroxide solution may be set appropriately.

With this treatment performed, anomalous bodies 8 are effectively removed. Further, it gives rise of an increase in surface roughness at the bottom section of the contact hole as well as the first polycrystalline silicon film 5, and leads also to the formation of thin films of silicon oxide 9a and 9b thereon (FIG. 3(b)).

Figure 4:
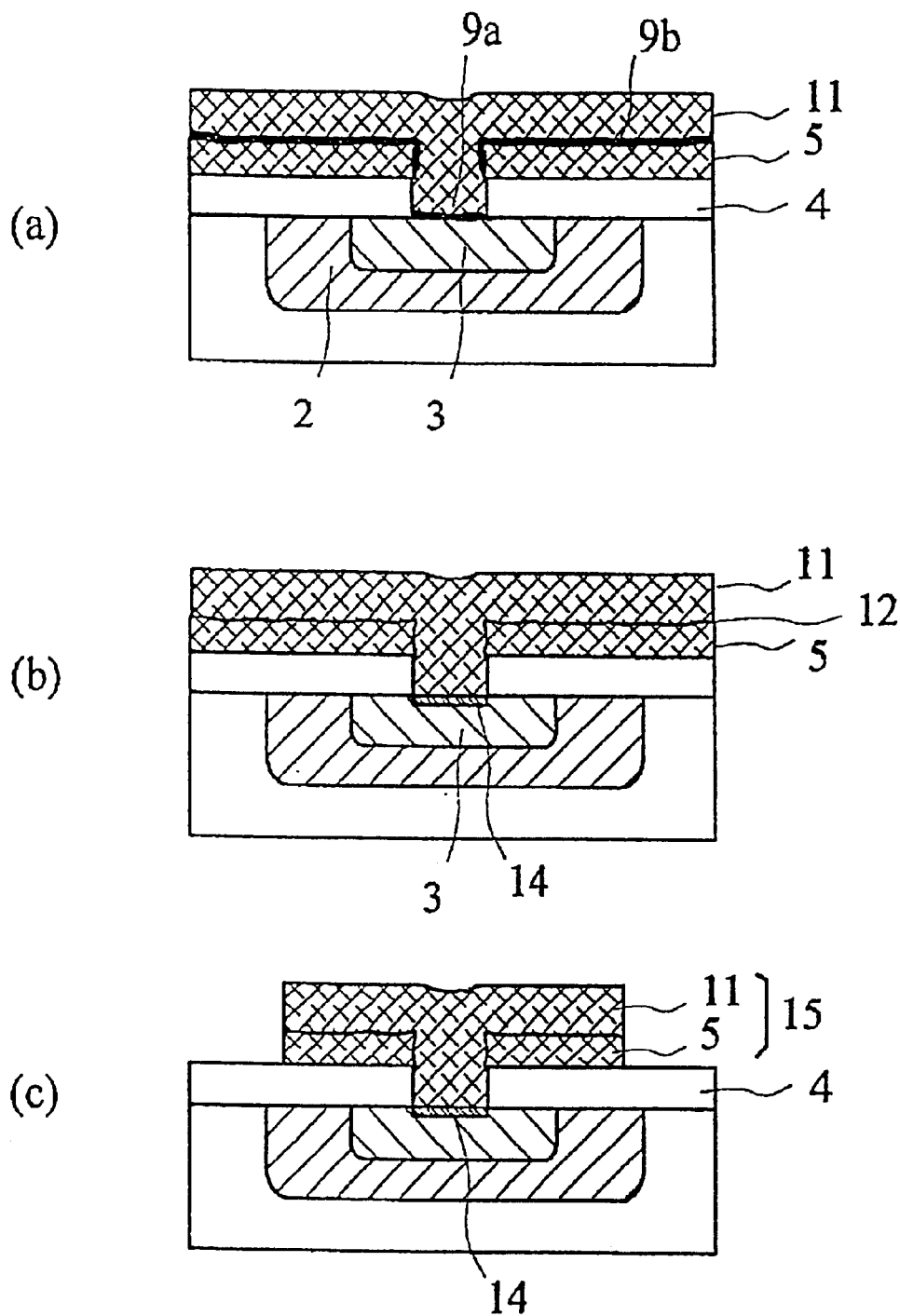
FIGS. 4(a) to (c) are a series of views explaining steps for forming an emitter region and an emitter electrode in a process of the present invention.
Figure 5:
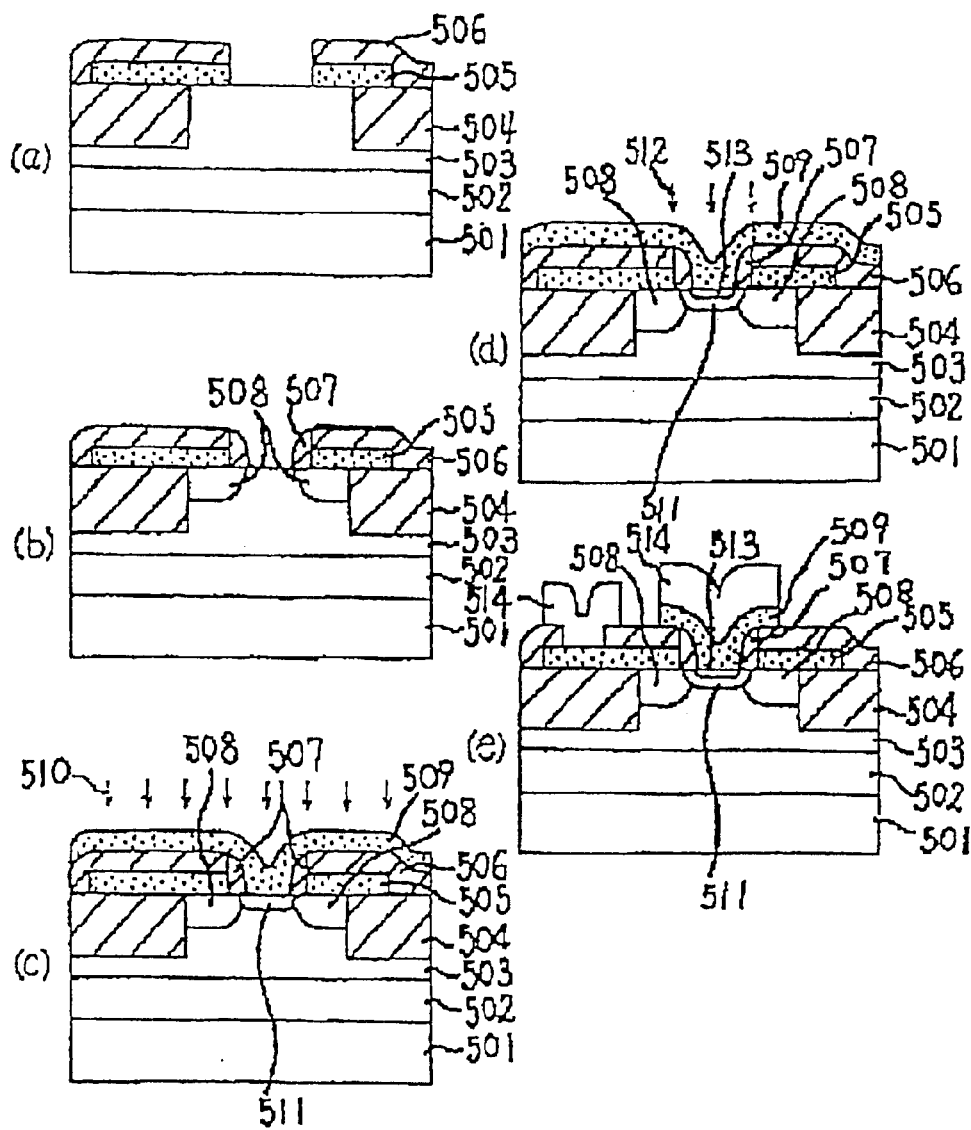
FIGS. 5(a) to (e) is a series of views explaining a conventional process for manufacturing a bipolar transistor with a SST structure.
Figure 6:
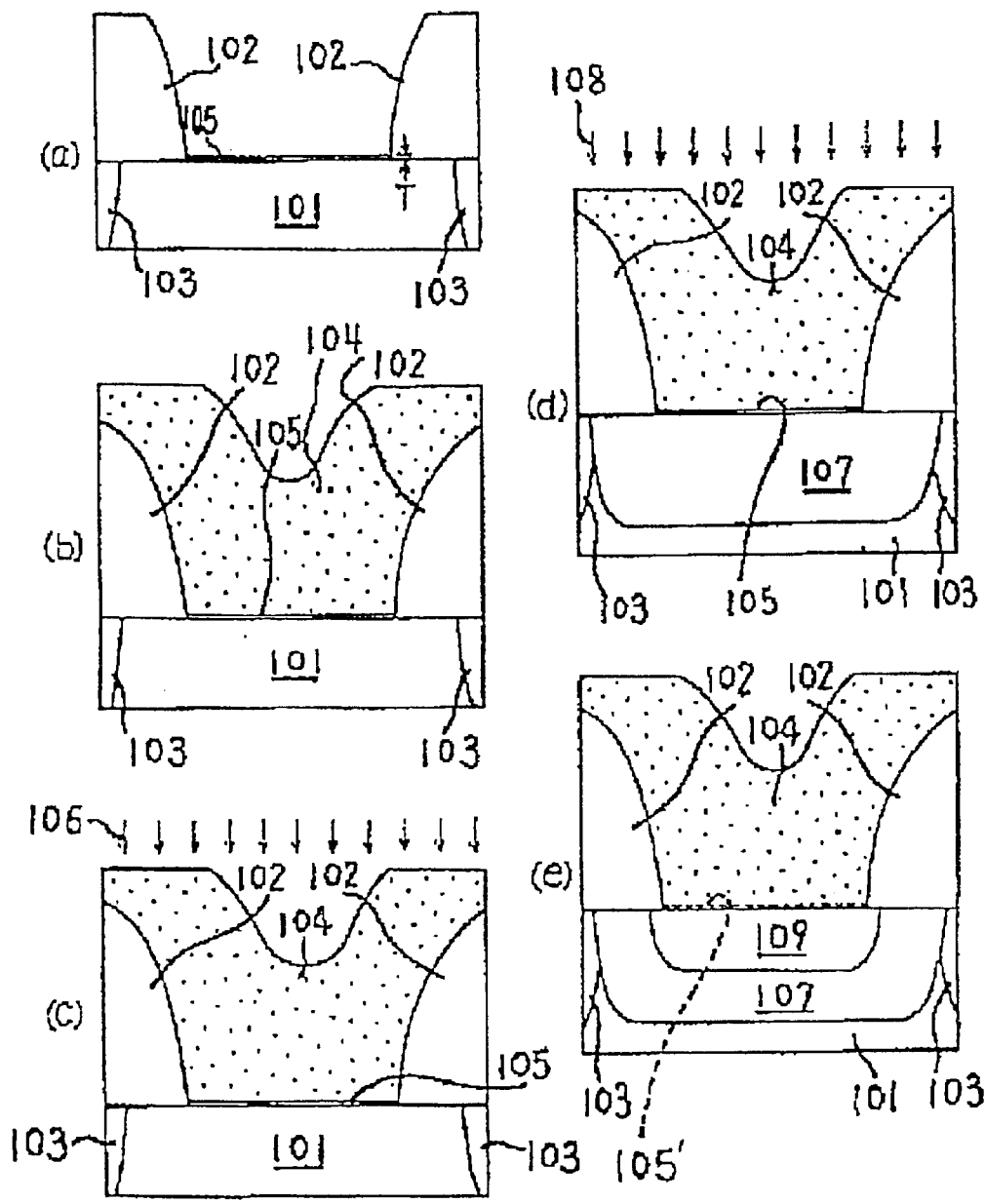
FIGS. 6(a) to (e) are a series of views explaining another conventional process for manufacturing a bipolar transistor.
Figure 7:
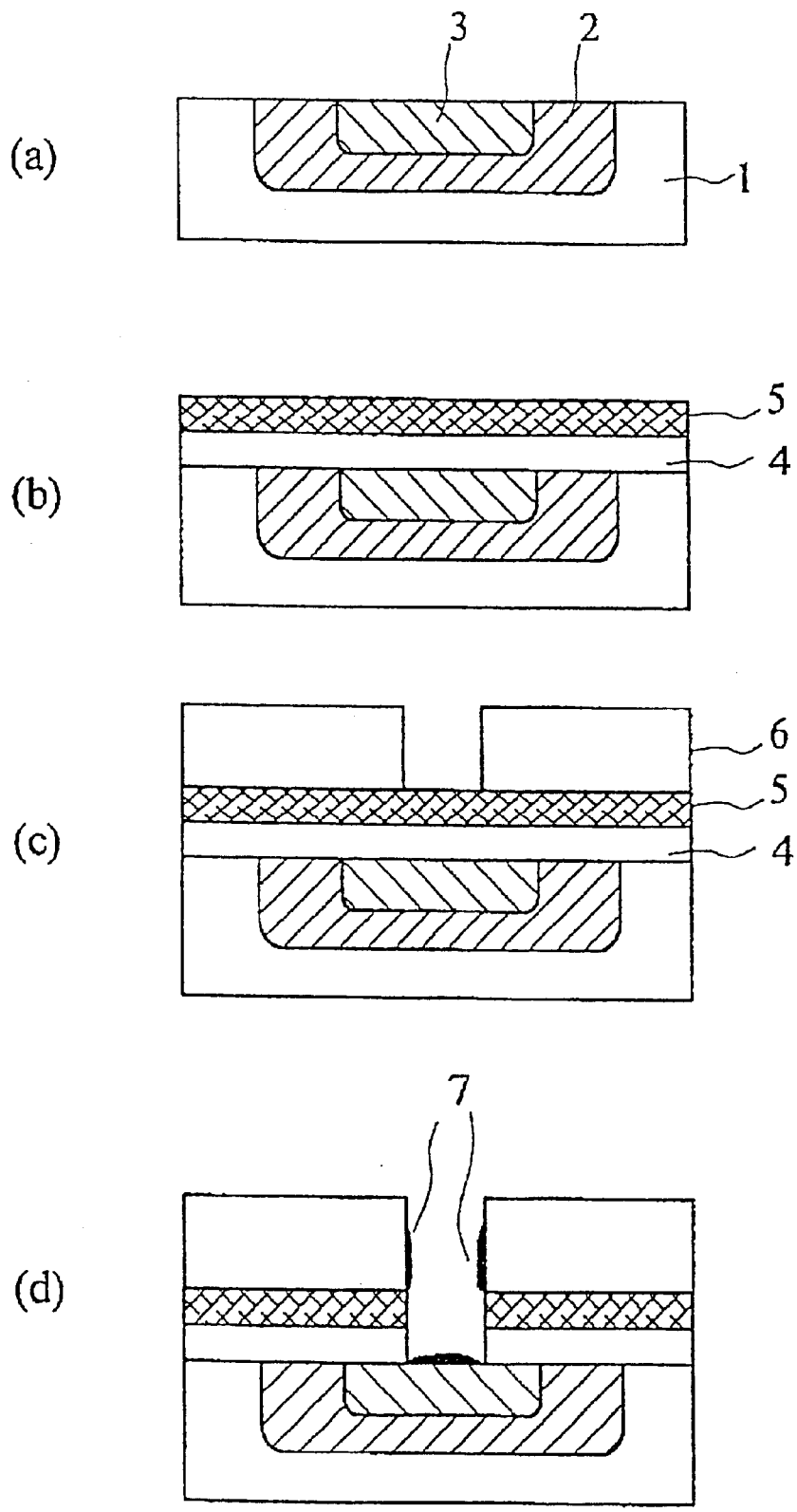
FIGS. 7(a) to (d) are a series of views explaining steps for forming an opening to reach a base region in a conventional process for manufacturing a bipolar transistor with conventional structure.
Figure 8:
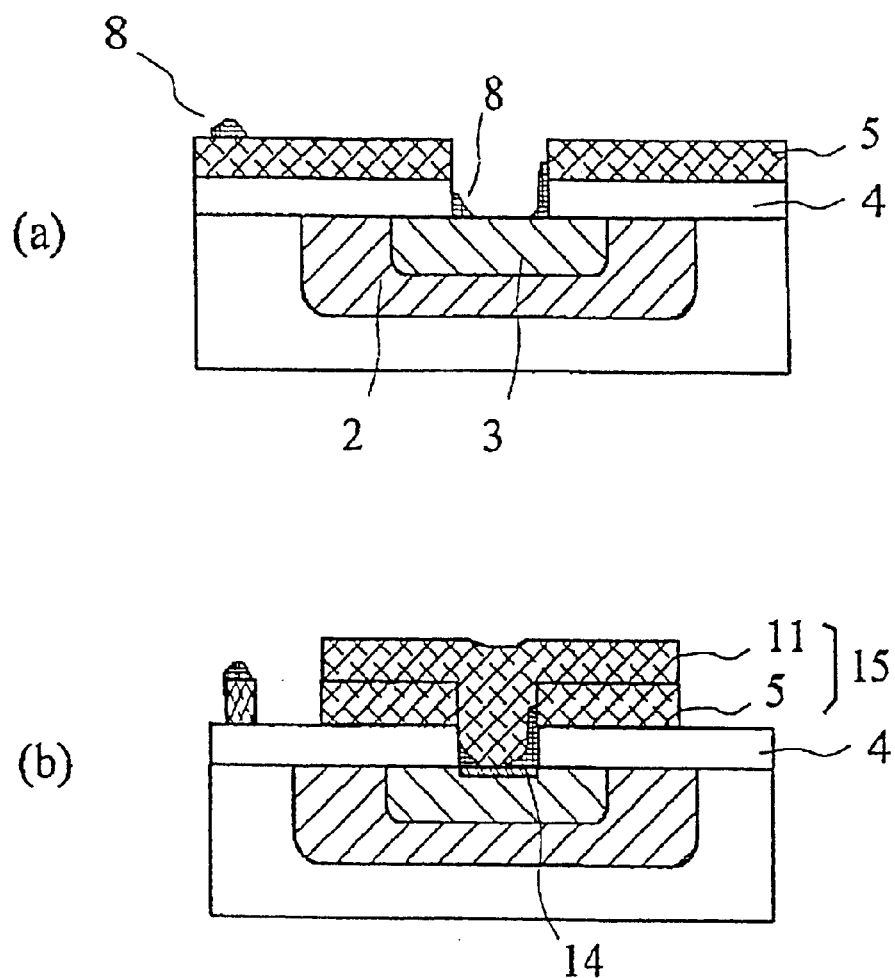
FIGS. 8(a) and (b) are a couple of views explaining the problem in a conventional manufacturing process for manufacturing a bipolar transistor with conventional structure.

Next, after a second polycrystalline silicon film 11 is deposited over the entire surface of the substrate so as to fill up the inside of the contact hole, n-type dopants are ion-implanted into the second polycrystalline silicon film 11 (FIG. 4(a)).

After that, by applying a heat treatment to the whole substrate, then- type dopants are diffused into the base region 3 to form an emitter region 14. Hereat, the thin films of silicon oxide 9a and 9b are balled-up, resulting in their disappearance (FIG. 4(b)). In the drawings, this is depicted as an interface 12 after balling-up. For a method of the heat treatment, a lamp annealing method such as the RTA (Rapid Thermal Annealing) is preferable. This method allows an emitter region 14 to be formed as designed and also makes the thin films of silicon oxide 9a and 9b ball-up for sure. For the conditions of the heat treatment, the temperature is set to be preferably at 950° C. or higher and, for example, in a range of 1000–1100°C., and more preferably in a range of 1000–1050°C., and the treatment time period is set to be 10–60 seconds, for instance.

After that, the first polycrystalline silicon film 5 and the second polycrystalline silicon film 11 are shaped into an emitter electrode by selective etching, whereby a bipolar transistor is accomplished (FIG. 4(c)).

Figure 3:
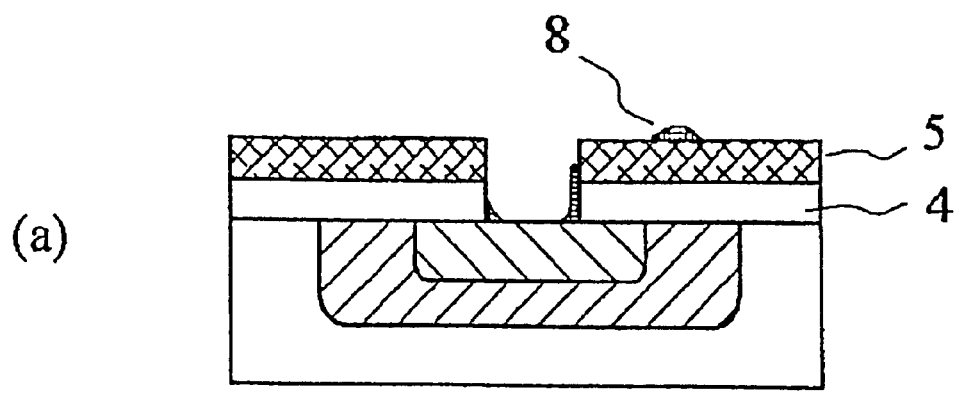
FIGS. 3(a) and (b) are a couple of views explaining the cleaning step of a process of the present invention.
Figure 3:
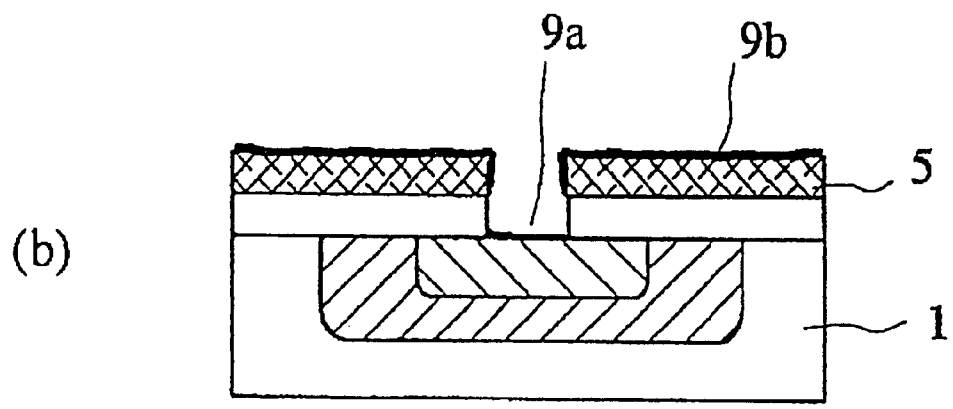

In the present invention, as the cleaning with the cleansing agent containing the oxidant and the alkali is carried out, the thin films of silicon oxide 9a and 9b are formed in the step of FIG. 3(b). Since silicon oxide films are higher hydrophilic than polycrystalline silicon, once such films are formed, no remnant solution is left on them, and thus generation of water-marks or anomalous bodies can be suppressed. Consequently, such a problem of generating anomalous bodies as described in Prior Art, referring to FIG. 3(b), does not arise any longer.

Further, in the conventional techniques, when the heating treatment of FIG. 3(b) is carried out, the second polycrystalline silicon film 11 may be converted into a single-crystalline form in the place where the second polycrystalline silicon film 11 comes into contact with the base region 3, and the phenomenon will bring about an increase in emitter resistance and a retard of the dopant diffusion into the base region 3. The present invention overcomes such a problem with effect. This effect is presumably attributed to fact that the surface roughness at the bottom section of the contact hole increases and a thin film of silicon oxide 9a is formed thereon. The single-crystallizing in the second polycrystalline silicon film 11 originates from the surface of the single crystal substrate and progresses along. In conventional techniques, an oxide film covers the surface of the silicon substrate that is the initiation origin for growth, so that the growth into single crystals is prevented. On the other hand, in the present invention, the growth of single crystal is inhibited not only by covering the initiation origin for growth with an oxide film but also by the reduced smoothness of the surface for growth. Furthermore, the oxide film itself is formed through the use of a cleansing agent, so that its thin thickness can be better controlled, and what is more, its film quality can be more uniform, in comparison with those formed by thermal oxidation or natural oxidation in the air. In consequence, it can ball-up certainly, so that it can lower the emitter electrode resistance and regulate the emitter dopant concentrations according to the design, which leads to a stable $h_{FE}$.

In addition, in the present embodiment, since polycrystalline silicon constituting the emitter electrode is formed in two separate steps for the first polycrystalline silicon film 5 on the insulating film 4 and the second polycrystalline silicon film 11 thereon, it is possible to prevent an insulating film such as a silicon oxide film to be dissolved by a cleansing agent containing hydrofluoric acid or its salt. As a result, the film thinning or proceeding in side etching within the contact hole can be suppressed.

Besides, although the present embodiment illustrates application to a bipolar transistor having an emitter electrode composed of polycrystalline silicon as an example, it is to be well-understood that the present invention may be applied to a bipolar transistor having such an electrode structure as shown in FIG. 1(b), in which a high-refractory metal such as tungsten is laid over polycrystalline silicon.

EXAMPLES

In the examples presented hereafter, bipolar transistors each having a structure shown in FIG. 1(a) were fabricated and their performances were evaluated. The steps of a method fabricating these bipolar transistors are described below.

First, as shown in FIG. 2(a), a collector region 2 was formed by ion-implanting phosphorus into the surface of a silicon substrate 1; a base region 3 was then formed by ion-implanting boron on the surface of the collector region 2; and Following that, an insulating film 4 of silicon oxide was formed over these surfaces. The insulating film 4 was grown by the LPCVD method in a circumstance heated up to 800–820° C. or so, and its thickness was selected in a range of 50–100 nm or so. Next, a first polycrystalline silicon film 5 was deposited thereon into a thickness of 50–100 nm or so (FIG. 2(b)). On this first polycrystalline silicon film 5, a resist 6 with an opening was then formed (FIG. 2(c)), and using this resist 6 as a mask, a contact hole to reach the base region 3 was formed by means of dry etching.

Subsequently, ashing and a treatment with a resist-peeling agent were conducted and, then, a cleaning was carried out using hydrofluoric acid or its salt, followed by a rinsing with pure water. The resist 6 and the etching residues 7 were removed thereby (FIG. 3(a)). After that, a cleaning with the APM (ammonia:hydrogen peroxide:water=1:4:20 (in volume ratio)) was carried out. The temperature for this treatment is preferably set to be 50–70° C., and in the present example, it was set 60° C. or so. The time period of treatment was 3–5 minutes. After a rinsing with pure water was performed, the substrate was dried (FIG. 3(b)).

Next, after a second polycrystalline silicon film 11 was deposited over the entire surface of the substrate so as to fill up the inside of the contact hole, arsenic were ion-implanted into the second polycrystalline silicon film 11 (FIG. 4(a)).

After that, by applying a heat treatment to the whole substrate by means of the RTA, arsenic was diffused into the base region 3 to form an emitter region 14. The temperature for this treatment was set to be 1025° C. and its time period, 40 seconds (FIG. 4(b)).

Sequentially, the first polycrystalline silicon film 5 and the second polycrystalline silicon film 11 were shaped into an emitter electrode 15 through selective etching, whereby a bipolar transistor was accomplished (FIG. 4(c)).

Figure 9:
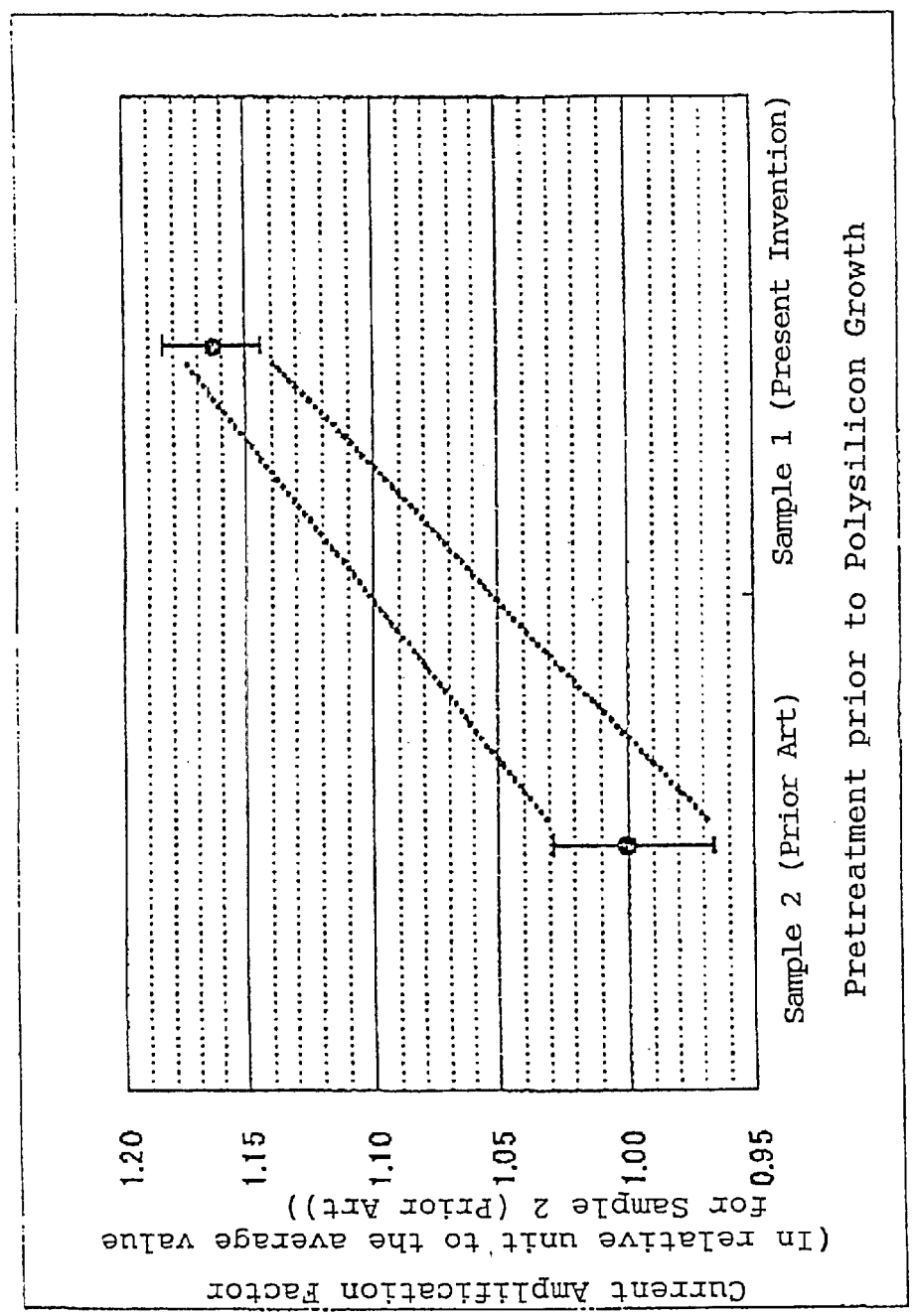
FIG. 9 compares results of evaluation of the current amplification factors for bipolar transistors fabricated in Examples.

Bipolar transistors obtained in the way described above were taken as Samples 1. Further, in addition to those, other bipolar transistors were fabricated in the similar way as described above, except that a cleaning with the APM was not carried out. These devices obtained in the latter way were taken as Samples 2. When the $h_{FE}$ for both the samples were measured, the current amplification factor $h_{FE}$ for Sample 1 displayed a marked increase as well as a substantially reduced deviation. Moreover, the emitter electrode resistance for Sample 1 showed an excellent value. In short, it is confirmed that the bipolar transistor prepared in the process of the present invention will demonstrate a little variation in $h_{FE}$ and exhibit a stable device performance (FIG. 9).

ADVANTAGES OF THE INVENTION

As explained in detail above, the process according to the present invention can suppress certainly the single-crystallizing of polycrystalline silicon that is to constitute an emitter electrode, as well as to prevent the interface oxide film from remaining, when a heat treatment is conducted to diffuse dopants. Therefore, the process according to the present invention can lower the emitter electrode resistance and also regulate the emitter dopant concentrations according to the design, which will provide a stable $h_{FE}$.

Further, the process according to the present invention can prevent anomalous bodies such as water-marks to be produced in a cleaning step following the step for dry etching to form an emitter electrode, and thereby the process will achieve an increase in yield as well as an enhancement of device reliability.

What is claimed is:

1. A process for manufacturing a semiconductor device comprising the steps of:
   forming a collector region of a first conductive type in the vicinity of the surface of a silicon substrate and a base region of a second conductive type to lie on the surface of the collector region;
   forming an insulating film on said silicon substrate;
   forming a contact hole to reach said base region by etching said insulating film selectively;
   cleaning the surface of said insulating film and the inside of said contact hole, using a cleansing agent containing an oxidant and an alkali;
   forming a polycrystalline silicon film over the entire surface so as to fill up said contact hole and thereafter implanting dopants of the first conductive type into said polycrystalline silicon film;
   applying a heat treatment to the whole substrate to diffuse said dopants into said base region and thereby forming an emitter region of the first conductive type; and
   shaping said polycrystalline silicon film into an emitter electrode by selective etching.

2. A process for manufacturing a semiconductor device; comprising the steps of:

forming a collector region of a first conductive type in the vicinity of the surface of a silicon substrate and a base region of a second conductive type to lie on the surface of said collector region;

forming an insulating film and a first polycrystalline silicon film on said silicon substrate in this order;

forming a contact hole to reach said base region by etching said insulating film and the first polycrystalline silicon film selectively:

cleaning the surface of said first polycrystalline silicon film and the inside of said contact hole, using a cleansing agent containing an oxidant and an alkali;

forming a second polycrystalline silicon film over the entire surface so as to fill up said contact hole and thereafter implanting dopants of the first conductive type into said first and second polycrystalline silicon films;

applying a heat treatment to the whole substrate to diffuse said dopants into said base region and thereby forming an emitter region of the first conductive type; and shaping said first and second polycrystalline silicon films into an emitter electrode by selective etching.

3. A process for manufacturing a semiconductor device claimed in claim 1, wherein, after forming said contact hole, a cleaning with a cleansing agent containing hydrofluoric acid or its salt is carried out and, then, said cleaning with the cleansing agent containing the oxidant and the alkali is conducted.

4. A process for manufacturing a semiconductor device claimed in claim 1, wherein, after forming said contact hole, a cleaning with a cleansing agent containing hydrofluoric acid or its salt is carried out and, then, another cleaning with a cleansing agent containing an oxidant and an acid is performed, and thereafter said cleaning with the cleansing agent containing the oxidant and the alkali is conducted.

5. A process for manufacturing a semiconductor device claimed in claim 1, wherein, after forming said contact hole, a cleaning with a cleansing agent containing hydrofluoric acid or its salt is carried out and, then, said cleaning with the cleansing agent containing the oxidant and the alkali is performed, and thereafter another cleaning with a cleansing agent containing an oxidant and an acid is conducted.

6. A process for manufacturing a semiconductor device claimed in claim 2, wherein, after forming said contact hole, a cleaning with a cleansing agent containing hydrofluoric acid or its salt is carried out and, then, said cleaning with the cleansing agent containing the oxidant and the alkali is conducted.

7. A process for manufacturing a semiconductor device claimed in claim 2, wherein, after forming said contact hole, a cleaning with a cleansing agent containing hydrofluoric acid or its salt is carried out and, then, another cleaning with a cleansing agent containing an oxidant and an acid is performed, and thereafter said cleaning with the cleansing agent containing the oxidant and the alkali is conducted.

8. A process for manufacturing a semiconductor device claimed in claim 2, wherein, after forming said contact hole, a cleaning with a cleansing agent containing hydrofluoric acid or its salt is carried out and, then, said cleaning with the cleansing agent containing the oxidant and the alkali is performed, and thereafter another cleaning with a cleansing agent containing an oxidant and an acid is conducted.

9. A process for manufacturing a semiconductor device claimed in claim 1, wherein said cleansing agent containing the oxidant and the alkali comprises hydrogen peroxide, ammonia and water.

10. A process for manufacturing a semiconductor device claimed in claim 1, wherein said heat treatment to form said emitter region is carried out by a lamp annealing method.

11. A process for manufacturing a semiconductor device claimed in claim 9, wherein said heat treatment to form said emitter region is carried out by a lamp annealing method.

12. A process for manufacturing a semiconductor device claimed in claim 2, wherein said cleansing agent containing the oxidant and the alkali comprises hydrogen peroxide, ammonia and water.

13. A process for manufacturing a semiconductor device claimed in claim 3, wherein said cleansing agent containing the oxidant and the alkali comprises hydrogen peroxide, ammonia and water.

14. A process for manufacturing a semiconductor device claimed in claim 4, wherein said cleansing agent containing the oxidant and the alkali comprises hydrogen peroxide, ammonia and water.

15. A process for manufacturing a semiconductor device claimed in claim 5, wherein said cleansing agent containing the oxidant and the alkali comprises hydrogen peroxide, ammonia and water.

16. A process for manufacturing a semiconductor device claimed in claim 2, wherein said heat treatment to form said emitter region is carried out by a lamp annealing method.

17. A process for manufacturing a semiconductor device claimed in claim 3, wherein said heat treatment to form said emitter region is carried out by a lamp annealing method.

18. A process for manufacturing a semiconductor device claimed in claim 4, wherein said heat treatment to form said emitter region is carried out by a lamp annealing method.

19. A process for manufacturing a semiconductor device claimed in claim 5, wherein said heat treatment to form said emitter region is carried out by a lamp annealing method.

20. A process for manufacturing a semiconductor device claimed in claim 6, wherein said heat treatment to form said emitter region is carried out by a lamp annealing method.

* * * * *